(12) United States Patent
Inaba et al.

(10) Patent No.: US 7,017,027 B2
(45) Date of Patent: Mar. 21, 2006

(54) ADDRESS COUNTER CONTROL SYSTEM WITH PATH SWITCHING

(75) Inventors: Tomoyuki Inaba, Tokyo (JP); Kiyoshi Nakai, Tokyo (JP); Hideaki Kato, Tokyo (JP)

(73) Assignees: Elpida Memory, Inc., Tokyo (JP); Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 324 days.

(21) Appl. No.: 10/669,303

(22) Filed: Sep. 24, 2003

(65) Prior Publication Data

US 2004/0062128 A1 Apr. 1, 2004

(30) Foreign Application Priority Data

Sep. 26, 2002 (JP) ............................. 2002-281045

(51) Int. Cl.
*G06F 9/00* (2006.01)
*G06F 12/02* (2006.01)
*G05F 12/16* (2006.01)

(52) U.S. Cl. ..................... 711/219; 711/104; 711/105; 711/154; 711/217; 711/165; 365/222

(58) Field of Classification Search ................ 711/154, 711/106, 165, 217
See application file for complete search history.

(56) References Cited

U.S. PATENT DOCUMENTS 4,296,480 A * 10/1981 Eaton et al. ................ 365/222
4,503,525 A * 3/1985 Malik et al. ................ 365/222
4,587,559 A * 5/1986 Longacre et al. ........... 348/718
4,631,701 A * 12/1986 Kappeler et al. ........... 711/106
4,648,032 A * 3/1987 Romero et al. ............. 345/571
5,265,231 A * 11/1993 Nuwayser ................... 711/106

(Continued)

FOREIGN PATENT DOCUMENTS

JP          56-98781          8/1981

(Continued)

OTHER PUBLICATIONS

Seibert, On-chip refresh address counter circuit, Feb. 1982, IBM TDB, vol. 24 No 9, pp. 4673-4674.*

*Primary Examiner*—B. James Peikari
*Assistant Examiner*—Leonid Kravets
(74) *Attorney, Agent, or Firm*—Scully, Scott, Murphy & Presser, P.C.

(57) ABSTRACT

An address-counter control system includes a counter circuit, path switches, and a control circuit. The counter circuit includes a first series of address counters which corresponds to a non-contiguous region portion and second and third series of address counters which correspond to respective contiguous region portions and which are located at two opposite ends of the first series of address counters. The path switches are provided at connection paths between the second and the third series of address counters. The path switches disconnect the first series of address counters and directly connect the second and third series of address counters or disconnect the direct connection between the second and third series of address counters and connect the first series of address counters to and between the second and the third series of address counters. The control circuit control the path switches.

6 Claims, 9 Drawing Sheets

U.S. PATENT DOCUMENTS

| | | | | |
|---|---|---|---|---|
| 5,283,885 A | * | 2/1994 | Hollerbauer | 711/106 |
| 5,305,274 A | * | 4/1994 | Proebsting | 365/222 |
| 5,790,468 A | * | 8/1998 | Oh | 365/222 |
| 5,966,725 A | * | 10/1999 | Tabo | 711/106 |
| 5,999,473 A | * | 12/1999 | Harrington et al. | 365/222 |
| 6,134,168 A | * | 10/2000 | Harrington et al. | 365/222 |
| 6,490,215 B1 | * | 12/2002 | Komura et al. | 365/222 |
| 2001/0018726 A1 | * | 8/2001 | Tabo | 711/106 |
| 2001/0034820 A1 | * | 10/2001 | Mann | 711/167 |
| 2002/0018389 A1 | * | 2/2002 | Ito et al. | 365/222 |

FOREIGN PATENT DOCUMENTS

JP        2002-56671        2/2002

* cited by examiner

ADDRESS COUNTER CONTROL SYSTEM WITH PATH SWITCHING

This application claims priority to prior application JP 2002-281045, the disclosure of which is incorporated herein by reference.

BACKGROUND OF THE INVENTION

This invention relates to address-counter control systems used for refresh operations required for volatile memories, such as DRAMs (dynamic random access memories), having ECC (error checking and correcting) circuits. More particularly, this invention relates to an address-counter control system which has a simple structure and can be readily controlled.

To explain a known-type of address-counter control system, an ECC circuit and a refresh operation of a volatile memory will first be described.

In general, to avoid a loss of memory data due to aging, a volatile memory, such as a DRAM, executes a refresh operation for periodically reading memory data, amplifying it through a sense amplifier, and writing the amplified data back into the memory, as explained in Japanese Unexamined Patent Publication No. 56-98781 (see FIGS. 1 and 3 in the publication), which will be hereinafter referred to as a first document.

First, description will be made of an example of a refresh operation for a memory 10 with reference to FIG. 1. For a refresh operation, in the memory 10, a row-address signal for a refresh address is input via a row-decoder 11 to sequentially scan all the rows in a memory array 12 in an X direction, which is a column direction, without the use of a column decoder 13. Thus, all data bits in a Y direction, which is a row direction, are read for each row and are amplified by a sense amplifier 14, and the amplified data bits are written into the original memory elements to thereby prevent degradation of the memory bits.

The refresh address is internally and automatically created. That is, a ring oscillator, constituted by an oscillator circuit in which an odd number of inverters are connected in a ring, generates clock signals, and a refresh counter counts the clock signals to thereby sequentially generate the refresh address.

This refresh operation uses, for example, an ECC circuit for detecting error bits and for writing corrected data into the original memory elements using a known method, as described in the first document (see FIG. 3 thereof). This is adapted to repair memory elements crashed by radiation or the like.

Figure 2:
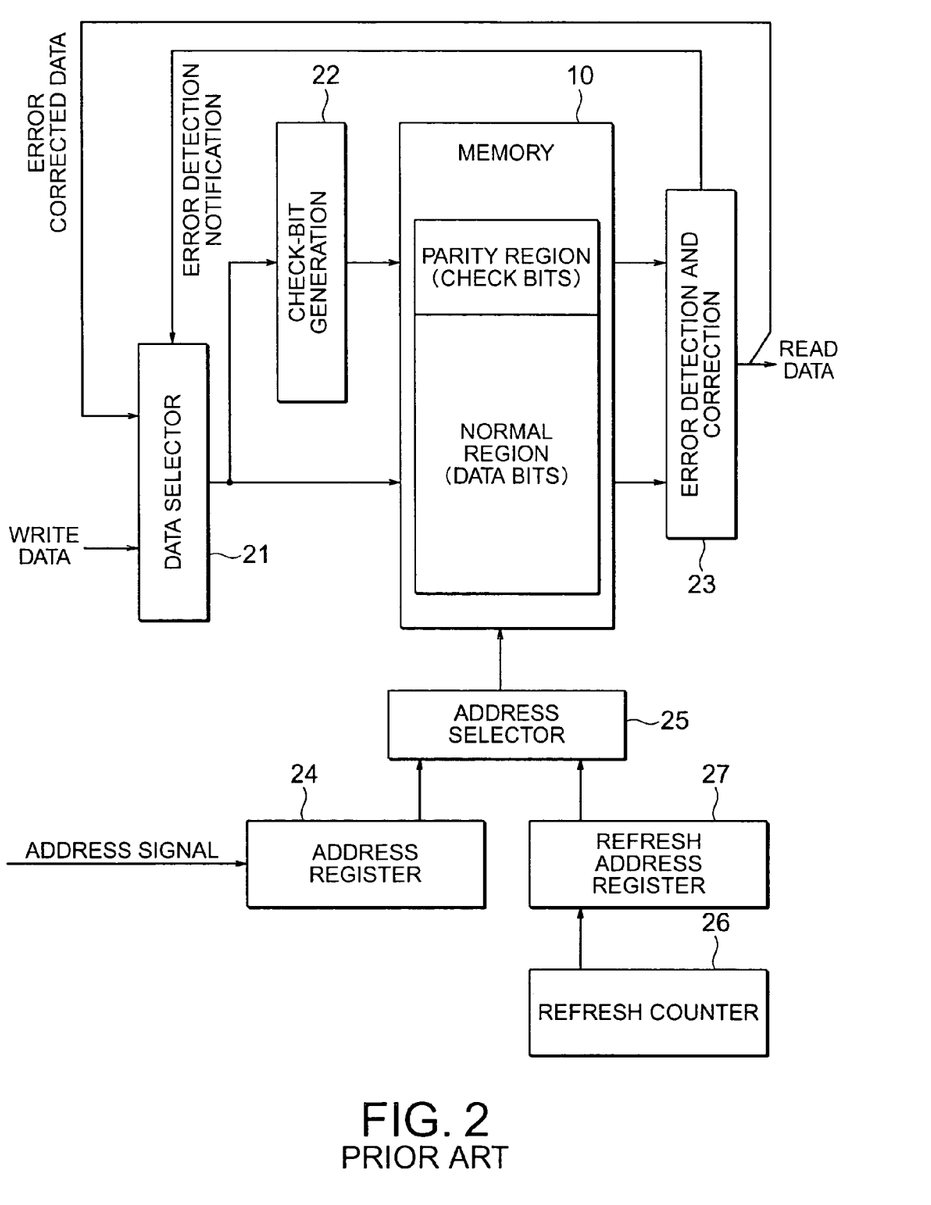
FIG. 2 is a functional block diagram illustrating one example of the basic structure of peripheral circuits of the memory.

Referring to FIG. 2, a refresh counter 26 sequentially activates an address register 27 for refreshing to control an address selector 25, thereby driving a row decoder.

An ECC circuit for the memory 10 will now be described with reference to FIG. 2. The memory 10 includes a normal region for data bits and a parity region for storing check bits (parity bits) for detecting an error. When write data is input into the memory 10 via a data selector 21, a check bit generator 22 monitors the data bits being input and generates check bits corresponding to the predetermined numbers of data bits. The generated check bits are written into predetermined locations, which correspond to the locations of the associated data bits, in the parity region in the memory 10.

During a refresh operation, an error detection and correction section 23 compares data bits read from the normal region in the memory 10 with check bits corresponding thereto read from the parity region. Upon detecting error bits, the error detection and correction section 23 locates the position thereof, inverts the bits, and sends the resulting bits, as error-corrected data, to the data selector 21, so that the data is written into the memory 10.

The refresh operation is executed for all the memory elements in the normal region and the parity region in the memory 10.

Figure 1:
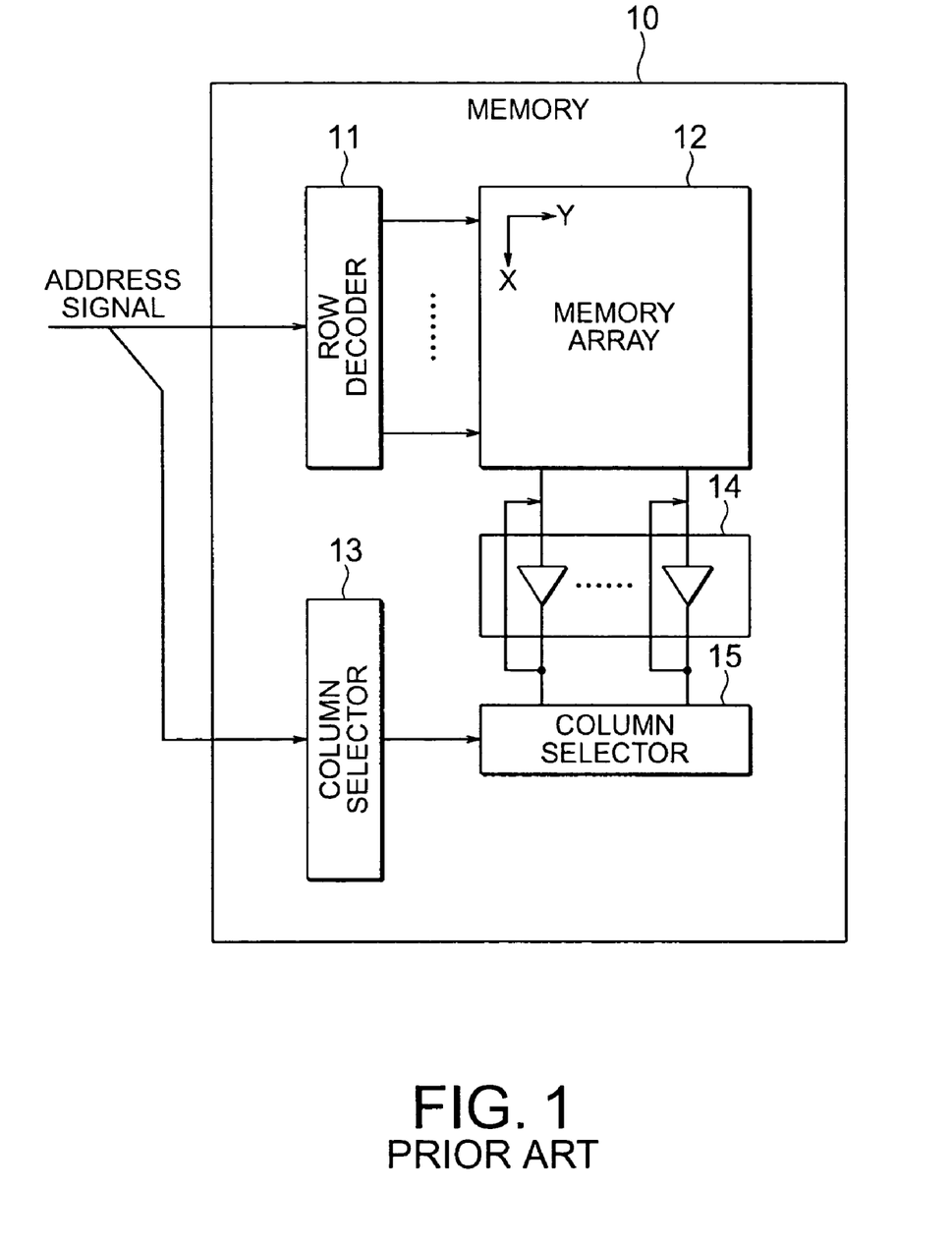
FIG. 1 is a functional block diagram illustrating one example of the basic structure of a memory.

For example, when the memory cells shown in FIG. 1 have an "m×n" matrix structure, upon reading or refreshing, a decoder 11 decodes a row address in the memory array 12 so that one-row line therein is selected. In this case, data of "n"-bit corresponding to the number of the columns is passed in parallel through the sense amplifier 14 and is amplified thereby.

For a normal reading operation, since the column decoder 13 decodes a column address and the column selector 15 selects one column line in the memory array 12, one of "n" bits is sent as read data to the outside.

For a refresh operation, reproduced data amplified by the sense amplifier 14 is returned to all the column lines in the memory array 12 and is written into the memory cells in a column line selected at this point.

Figure 3:
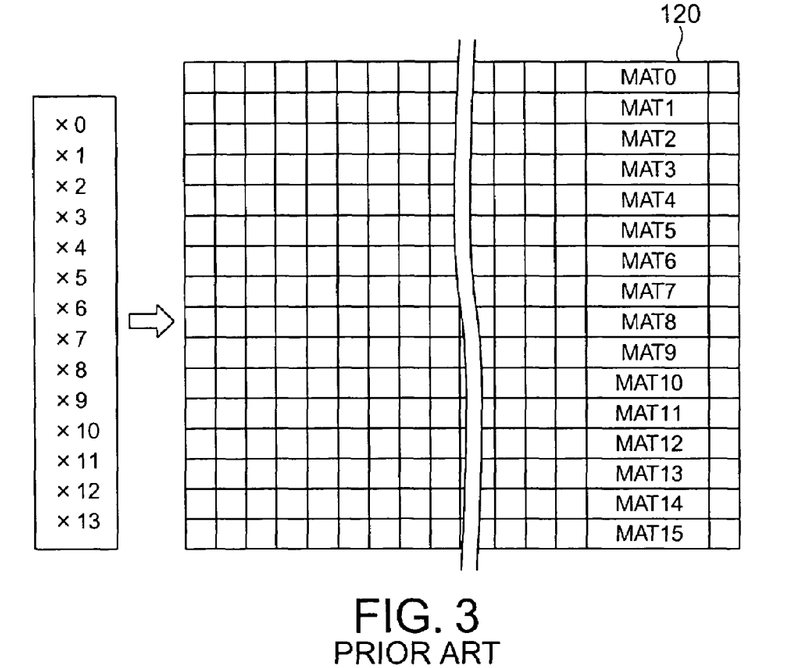
FIG. 3 is a schematic view illustrating one example of the relationship between a memory bank and row addresses.

The address configuration in a memory bank 120 constituted by the memory array 12 will now be described with reference to FIGS. 3 and 4. For example, in a 256-megabit address region, a normal address region (hereinafter referred to as a "normal region") in which data bits are stored uses row-addresses "x0 to x12". Of these addresses, four row addresses "x9 to x12" are used to divide one bank into 16 memory mats (hereafter referred to as "mats") 0 to 15 and nine row addresses "x0 to x8" are used to divide each mat into 512 subwords.

Meanwhile, arranging a parity address region (hereinafter simply referred to as a "parity region") for check bits in each mat minimizes a disadvantageous use of memory area. Thus, four addresses, i.e., row addresses "x9 to x12" are used to specify corresponding 16 mats in one bank, and an address of a row-address "x13" is used to specify partitioning between the normal region and the parity region. Four row addresses "x0 to x3" are sufficient since 16 parity address regions are provided for 512 subwords.

As a result, It is required that the refresh counter corresponds to the column addresses "x0 to x12" in the normal region and to the row addresses "x0 to x3" and "x9 to x13" in the parity region.

Figure 5A:
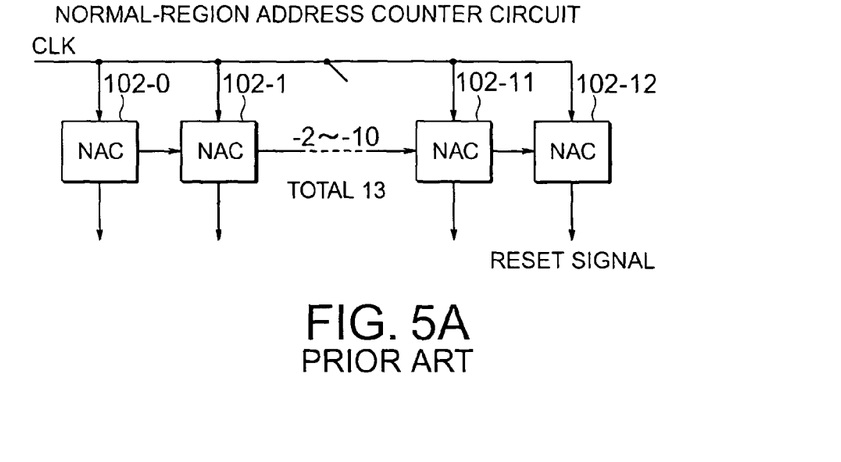
FIG. 5A shows an example of a normal-region address counter circuit.
Figure 5B:
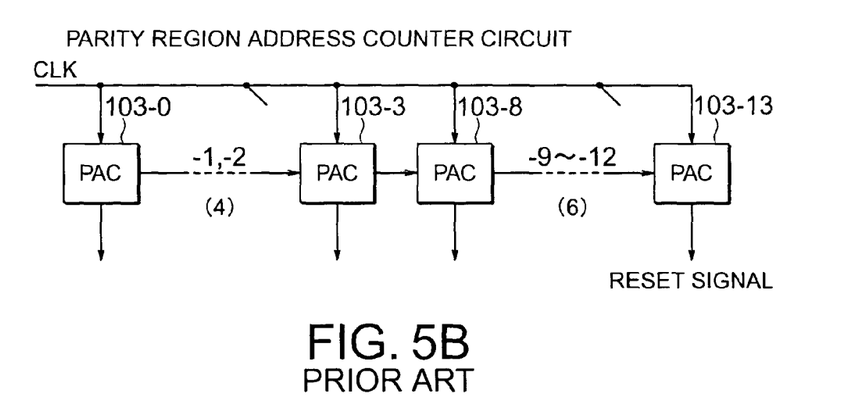
FIG. 5B shows an example of a parity-region address counter circuit.
Figure 5C:
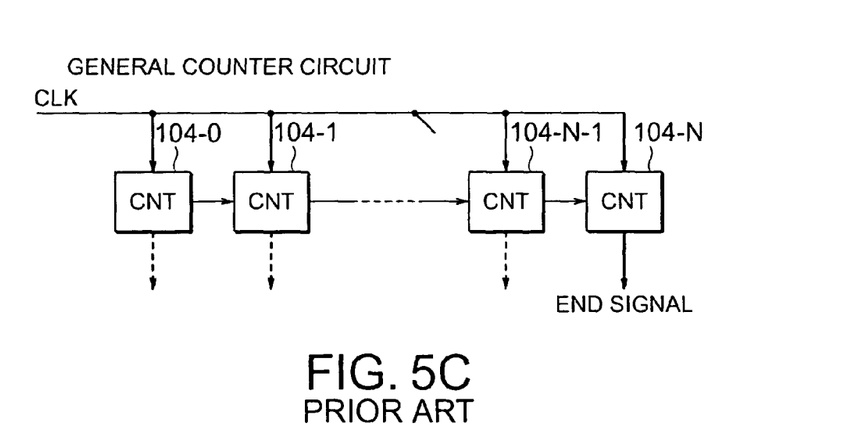
FIG. 5C shows an example of a general counter circuit.

As described above, the normal region and the parity region are in an irregular relationship. A counter circuit for refreshing, however, is not disclosed in the first document. Referring to FIGS. 5A, 5B, and 5C, for a typical refresh counter, two counter circuits, i.e., a normal-region address counter circuit shown in FIG. 5A and a parity-region address counter circuit shown in FIG. 5B are prepared. Thus, the counter circuit shown in FIG. 5A continuously counts contiguous addresses of normal-region address counters (NACs) 102-0 to 102-12 and the counter circuit shown in FIG. 5B continuously counts contiguous addresses of parity-region address counters (PACs) 103-0 to 103-3 and 103-9 to 103-13.

For a long-term refresh operation, a general counter circuit shown in FIG. 5C counts "N+1" addresses until the refresh operation for all the bits is completed.

Upon a long-term refresh operation, after refreshing the normal region, the refresh counter circuit refreshes the parity region. After completing the refreshing operation for all the regions, among internal power supplies, a power supply for a circuit that does not affect the data retaining operation is shut off for a certain period of time until the next refresh operation, to reduce power consumption.

Figure 6:
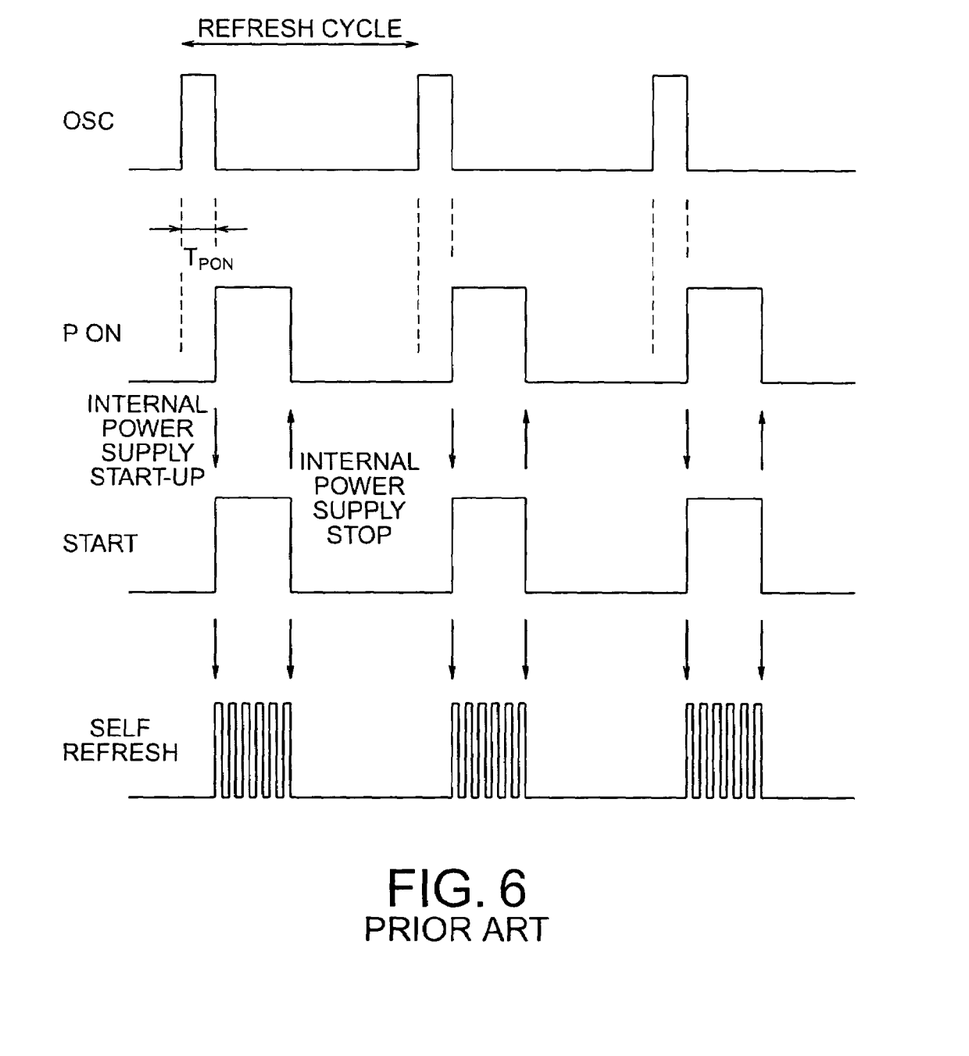
FIG. 6 is a waveform view illustrating examples of waveforms generated in a refresh cycle illustrated in the second document.

This pause period will now be described with reference to FIG. 6. Herein, it is to be noted that FIG. 6 makes reference to FIG. 34 of Japanese Unexamined Patent Publication No. 2002-56671 which will be hereinafter referred to as a second document.

In the illustrated example, a primary oscillator OSC defines the cycle of a refresh operation. After a pulse in the oscillator OSC rises and a specified time TPON elapses, an internal power supply rises. In response to the rise of the internal power supply, intensive refreshing is executed on all the bits in the memory. Upon completion of this refresh operation, the internal power supply is put into a pause state. This pause state continues, until another refresh cycle arrives and the next pulse rises in the primary oscillator OSC. Thus, to detect the completion of the refresh operation, the general counter circuit shown in FIG. 5C includes N+1 general counters (CNTs) 104-0 to 104-N.

Although neither of the first document nor the second document discloses a counter circuit for refreshing, a refresh counter typically requires three counter circuits, as described above.

The known address counter control circuit described above has a problem in that the area of a memory device must be disadvantageously reduced.

The reason will be as follows. Namely, the known address control circuit includes a counter for a normal region with contiguous addresses and a counter for a parity region with non-contiguous addresses and further includes a counter for detecting the completion of an entire refresh operation.

SUMMARY OF THE INVENTION

It is therefore an object of this invention to provide an address counter control circuit which has a simple structure and is capable of being controlled readily.

An address counter control circuit according to this invention is directed to a control system for a counter for supplying addresses to a device having a first contiguous-address region and a second address region that corresponds to the first contiguous-address region and that has a non-contiguous region portion. The address counter control circuit includes a counter circuit, path switches, and a control circuit.

The counter circuit includes address counters provided so as to correspond to the number of the first address regions. The address counters are constituted by a first series of address counters which corresponds to the non-contiguous region portion and second and third series of address counters which correspond to respective contiguous region portions and which are located at two opposite ends of the first series of address counters.

Path switches are provided at connection paths between the second and the third series of address counters. The path switches disconnect the first series of address counters and directly connect the second and third series of address counters or disconnect the direct connection between the second and third series of address counters and connect the first series of address counters to and between the second and the third series of address counters.

For forming the first address region, the control circuit controls the path switches to disconnect the direct connection between the second and the third series of address counters and connect the first series of address counters to and between the second and the third series of address counters, so that the non-contiguous region portion is placed in the first address region, and sequentially causes counting of the first, second, and third series of address counters. For putting the second address region into a contiguous state, the control circuit controls the path switches to disconnect the first series of address counters and directly connect the second and third series of address counters and sequentially causes counting of the second and third series of address counters.

With this structure, one counter circuit corresponding to the contiguous address region portion counts the address regions having the non-contiguous region portion. Thus, one counter circuit can counts addresses in two types of address regions. As a result, an area required for the memory device can be reduced.

Preferably, when all address counting for the first address region is completed in response to an output from an address counter for a final address in the first address region, the control circuit drives the path switches to start address counting for the second address region. Preferably, when all address counting is completed in response to an output from an address counter for a final address in the second address region, the control circuit generates an end signal indicating that all address counting for the first and second address regions is completed.

This controlling approach allows one counter circuit described above to recognize the completion of all counting for both of the first and second address regions. As a result, the general counter circuit shown in FIG. 5C can also be reduced.

Such a structure is advantageously applicable to a control system for a refresh counter for a memory device which requires refreshing and which includes a normal address region having "nth power of 2" contiguous addresses and a parity address region having a non-contiguous region portion with a number of non-contiguous addresses which is different from "nth power of 2".

Specifically, for a refresh operation for a volatile memory having an ECC circuit, such as a DRAM, the control circuit controls the path switches of the counter circuit. Thus, after completing the refreshing of all data bits in the contiguous address region, the same counter can be used to refresh all parity bits skipping the non-contiguous region portion. Additionally, the end of refreshing is recognized by an END signal, which allows automatic starting of a low-power state in which the memory device is in a pause period.

In the counter circuit, counting is started from a reset state and an output from the highest-order address counter is used to cause the control circuit to switch the path switches. The counting, however, can also be started at an address in the middle of the counter circuit.

In other words, the control circuit retains a counter value of one of the address counters. During a refresh operation of the memory device, for the normal region, the control circuit causes counting of an address counter following the address counter whose counter value is retained. In response to an address counter output that matches the retained counter value, the control circuit drives the path switches to start address counting for the parity address region. When all address counting for the parity address region is completed and the retained counter value is reached, the control circuit generates a refresh end signal indicating that all address counting for both of the normal and parity regions is completed.

According to this invention, an area required for the memory device can be reduced. This is because the address counters for the contiguous region are also used as address counters for the non-contiguous region portion. In other words, the counters located in the non-contiguous region portion in the contiguous region are disconnected using path switches and the disconnected portion is short-circuited to provide a continuous counter circuit. As a result, one counter for a continuous region can also be used as a counter for a non-contiguous region.

Further, according to this invention, switching control can be simplified. This is because the contiguous region and the non-contiguous region are distinguished by a row-address "x13" bit and the end of one circle of the contiguous region and the non-contiguous region is detected so that an END signal can also be generated. As a result, the general counters can also be integrated into the counter circuit. In addition, the memory device can be made more cost-effective.

DESCRIPTION OF THE PREFERRED EMBODIMENTS

Embodiments of this invention will now be described with reference to the accompanying drawings. The embodiments thereof can be applied to a memory device that has been described with reference to FIGS. 1 to 4.

Figure 7:
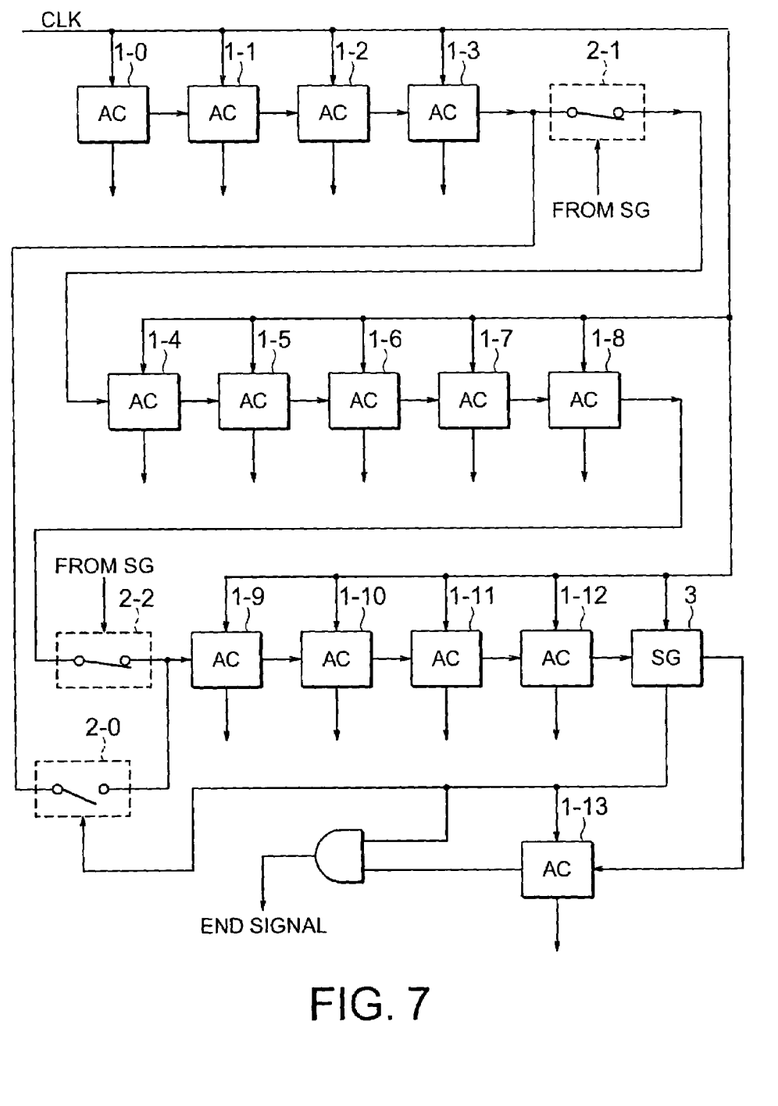
FIG. 7 is a circuit block diagram illustrating one embodiment of an address counter for a contiguous region according to the this invention.

FIG. 7 is a block diagram illustrating a counter circuit corresponding to a refresh operation for a normal address region, according to an embodiment of this invention.

As shown in FIG. 7, an address counter control circuit includes address counters (hereinafter referred to as "ACs") 1-0 to 1-13, path switches 2-0 to 2-2, and a switch-signal generator (hereinafter referred to as an "SG") 3 of a control circuit.

Figure 4:
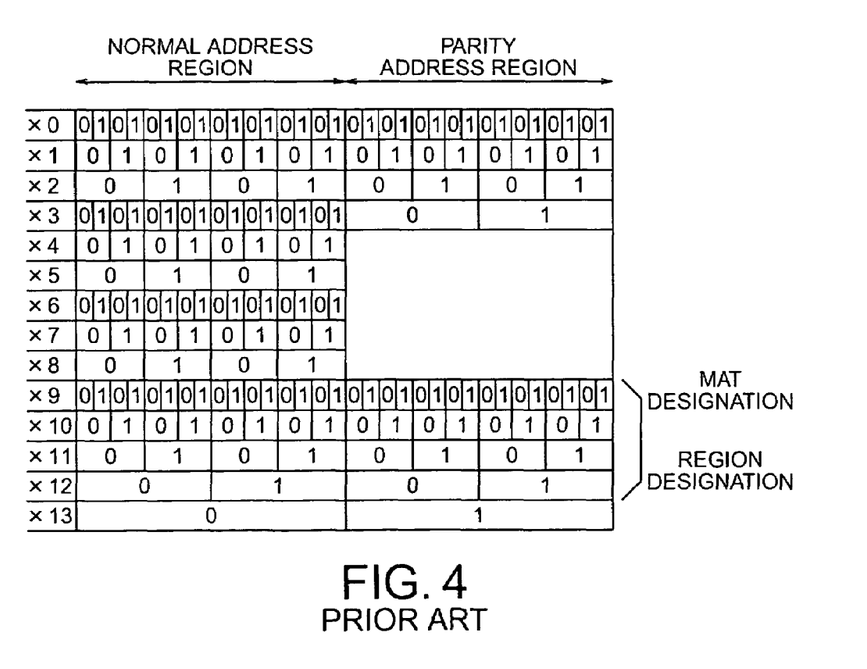
FIG. 4 is a schematic view illustrating one example of the association between the address counters and the normal and parity address regions in FIG. 3.

The ACs 1-0 to 1-12 corresponds to the respective row addresses "x0 to x12" shown in FIG. 4. The illustrated counter circuit is divided into three circuits, i.e., a series of ACs 1-0 to 1-3, a series of ACs 1-4 to 1-8, and a series of ACs 1-9 to 1-12, so as to correspond to the parity address region shown in FIG. 4. The ACs 1-4 to 1-8 correspond to a portion (the above-described non-contiguous region portion) corresponding to a non-contiguous region that is not used by parity address counters. The ACs 1-0 to 1-3 and ACs 1-9 to 1-12 correspond to the above-described contiguous region portions used for both the normal and parity addresses.

These three circuits are connected in series in such a manner that a path switch 2-1 closes a path between the AC 1-3 and the AC 1-4 and a path switch 2-2 closes a path between the AC 1-8 and the AC 1-9. The path switch 2-0 is provided at a connection path between the AC 1-3 and the AC 1-9. In FIG. 7, the path switch 2-0 opens the circuit to directly connect the AC 1-3 and the AC 1-9. Thus, in the counter circuit shown in FIG. 7, counting of the AC 1-0 to the AC 1-12 can be performed so as to correspond to the normal address region.

Figure 8:
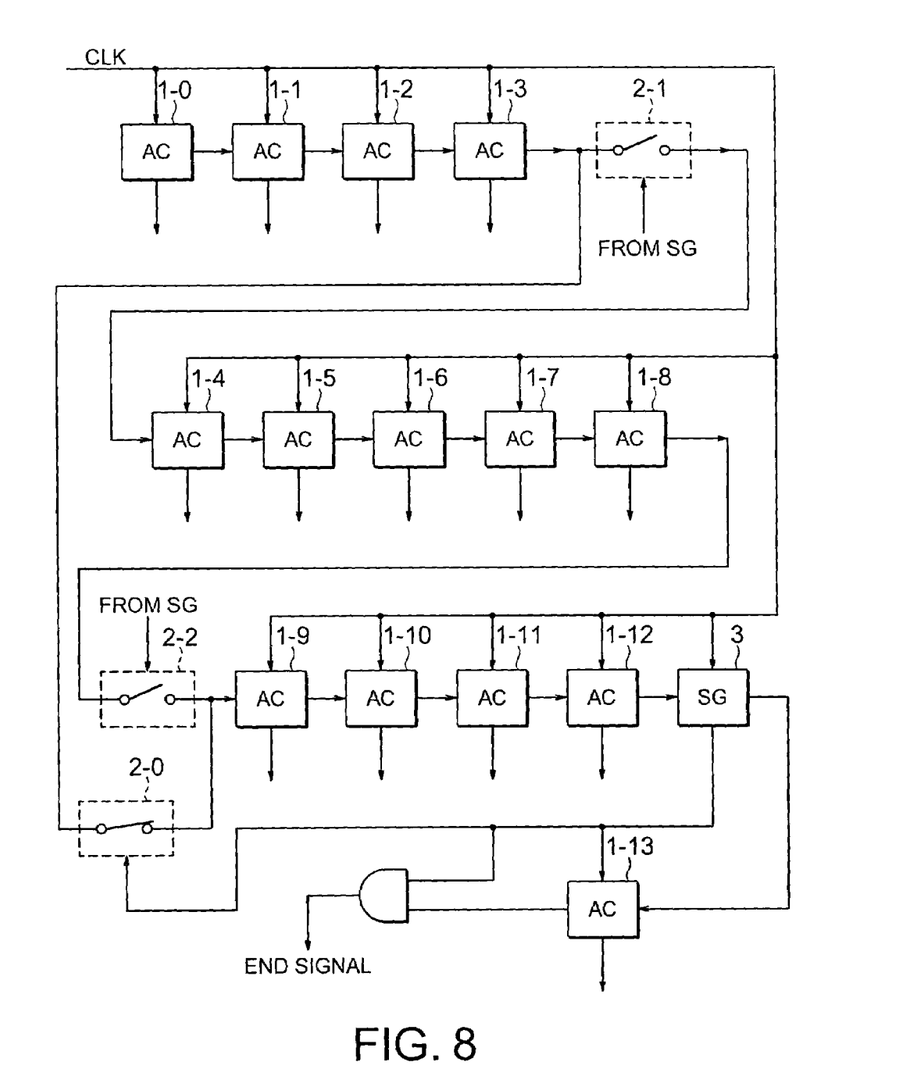
FIG. 8 is a circuit block diagram illustrating one embodiment when address counters are switched from the state shown in FIG. 7 so as to correspond to the non-contiguous regions.

In response to the counting of the ACs up to the AC 1-12, the SG 3 detects the final address and controls the path switches 2-0 to 2-2 to switch the path connections, so that the counter circuit enters a state shown in FIG. 8. The SG 3 also connects to the AC 1-13, which corresponds to the row address "x13", to check a bit. In the example of FIG. 4, the row address "x13" in the normal address region has a bit "0". Thus, in FIG. 7, the AC 1-13 receives the bit "0", so that the counter circuit does not generate an END signal for the refresh operation.

In FIG. 8, the path switch 2-0 closes the corresponding path and the path switches 2-1 and 2-2 open the corresponding paths. Therefore, the ACs 1-4 to 1-8 are disconnected from the counter circuit and the AC 1-3 is directly connected to the AC 1-9. Thus, the counter circuit shown in FIG. 8 can continuously obtain addresses in the parity address region shown in FIG. 2.

As in the same manner described above, in response to the counting of the ACs up to AC 1-12, the SG 3 shown in FIG. 8 controls the path switches 2-0 to 2-2 to switch the path connections. As a consequence, the counter circuit is put into a state shown in FIG. 7. The AC 1-13 receives a bit "1" of the address "x13" in the parity address region. Consequently, this counter circuit generates an END signal for the refresh operation.

Figure 10:
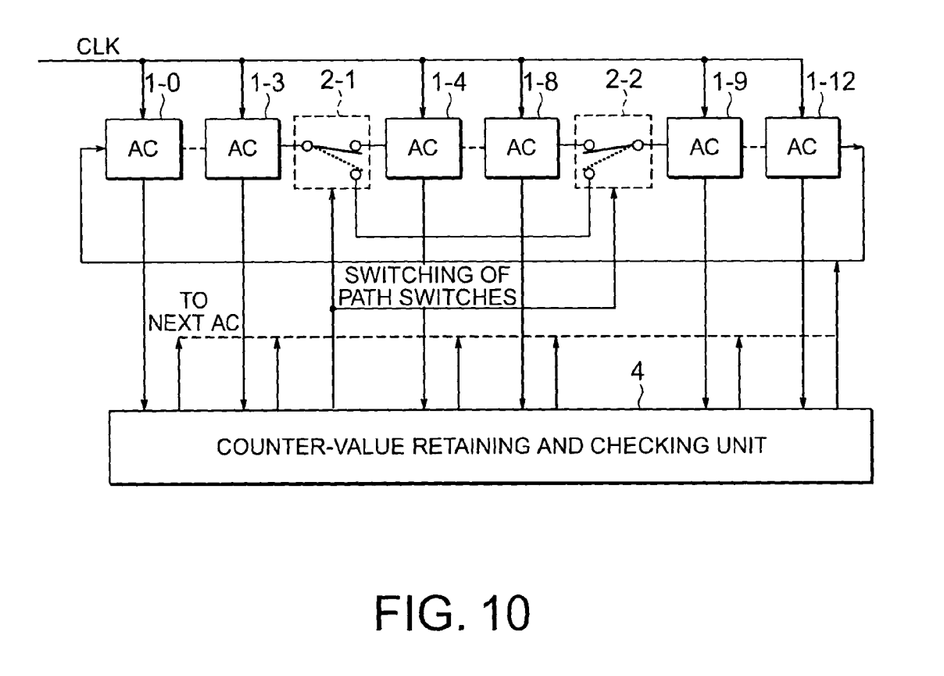
FIG. 10 is a circuit block diagram illustrating another embodiment to according to this invention.

In the above description, although the path switches 2-0 to 2-2 returns to the state shown in FIG. 7 from the state shown in FIG. 8, they may enter another state, for example, a state in which all the paths are open. In such a case, it is required that they are put into the state shown in FIG. 7 at the start of the refresh operation. Also, while three path switches 2-0 to 2-2 are provided in the above description, for example, a circuit as shown in FIG. 10 may be used in which two switches 2-1 and 2-2 are each directly connected using a transfer contact to another contact.

Figure 9:
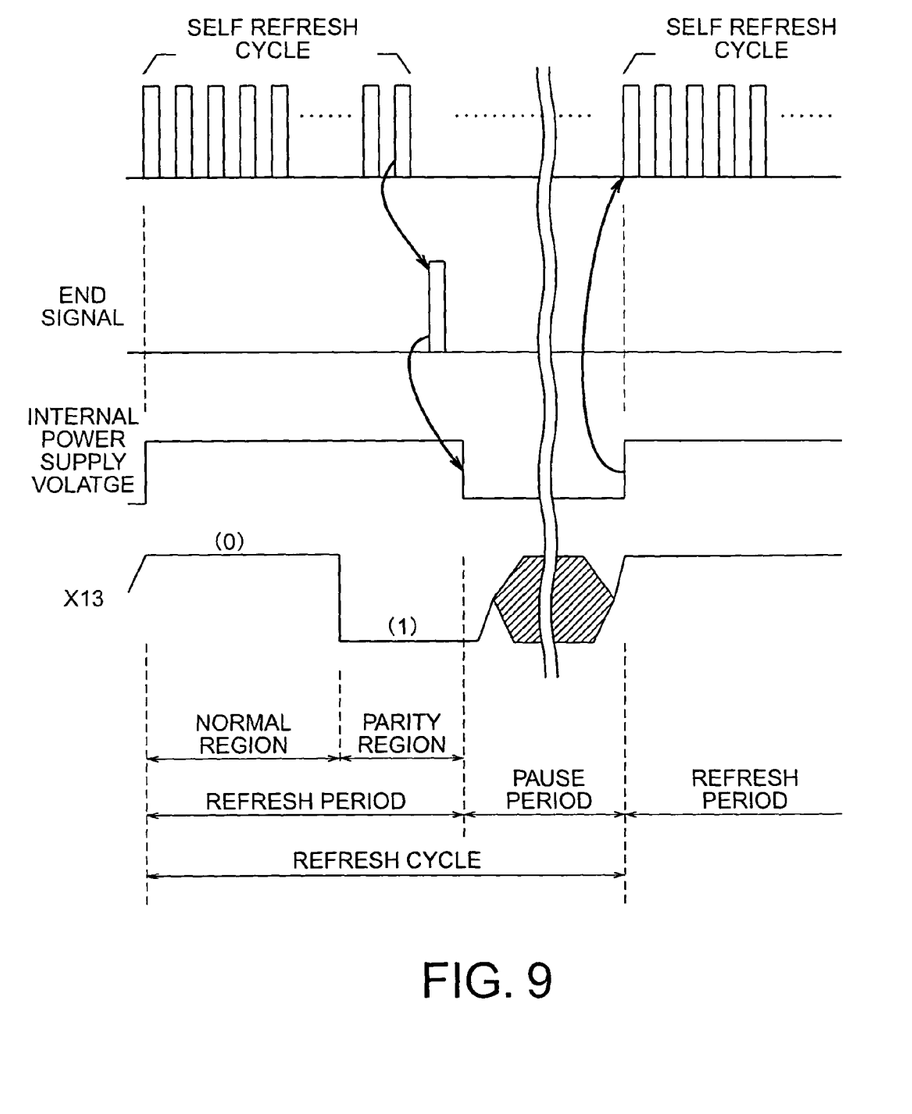
FIG. 9 is a diagram illustrating the generation of an END signal indicating the start of a pause period in the this invention.

Referring to FIG. 9, description will be made of a pause period in which power is at a low level. This pause period is essentially the same as that illustrated in FIG. 6.

A memory device that requires a refresh operation repeats a refresh operation at a predetermined refresh cycle. In this case, to reduce power consumption, periods other than the refresh operation are used as pause periods, for example, for shutting off a power supply, of internal power supplies, for a circuit that does not affect a data retaining operation.

As shown in FIG. 9, when a refresh operation for the normal region is started, an internal power source is switched on. During a period for the normal region, the address of the AC 1-13 has a bit "0". As described above, after the refresh operation for the normal region is completed, the parity region is refreshed. During this period, the address of the AC 1-13 has a bit "1". When the refresh operation is finished, an END signal is generated as described above, so that the memory device enters a pause period until the next refresh operation is started.

In the above description, although the switch-signal generator SG generates a path-switch switching signal in accordance with the final address, the highest-order address counter may generate the switching signal.

As shown in FIG. 10, a counter-value retaining and checking unit 4 may be provided so that any address counter can generate the path-switch switching signal. In such a case, the counter-value retaining and checking unit 4 stores a count-starting address and checks an address after completing one cycle of the counters. When those addresses match, one address counter generates the path-switch switching signal. That is, this is an address comparing and checking system.

In the above description, although the number of counters is "13", an expansion is possible depending on a memory capacity and the parity region can also be changed depending on a system. In addition, while a bit counter for two regions, i.e., the data region and the parity region, is used as a refresh counter, this invention is also applicable to a circuit in which another counter for the non-contiguous region is used together with a counter for the contiguous region.

In the above description, while reference has been made to the illustrated circuit blocks, changes, such as allocation due to separating and merging features, can be freely possible thereto as long as the features described above are accomplished. Such changes and modifications are also encompassed by this present invention. Thus, this invention is not limited by the above description and is also applicable to all address counters.

What is claimed is:

1. A control system for a counter for supplying addresses to a device having a first contiguous address region and a second address region that corresponds thereto and that has a non-contiguous region portion, the address-counter control system comprising:
   a counter circuit having address counters, the number of address counters corresponding to the first address region, the address counters comprising a first series of address counters which corresponds to the non-contiguous region portion and second and third series of address counters which correspond to respective contiguous region portions and which are located at two opposite ends of the first series of address counters;
   path switches that are provided at connection paths between the second and the third series of address counters, wherein the path switches disconnect the first series of address counters and directly connect the second and third series of address counters or disconnect the direct connection between the second and third series of address counters and connect the first series of address counters to and between the second and the third series of address counters; and
   a control circuit, wherein, for forming the first address region, the control circuit controls the path switches to disconnect the direct connection between the second and the third series of address counters and connect the first series of address counters to and between the second and the third series of address counters, so that the non-contiguous region is placed in the first address region, and sequentially causes counting of the first, second, and third series of address counters, and wherein, for putting the second address region into a contiguous state, the control circuit controls the path switches to disconnect the first series of address counters and directly connect the second and third series of address counters and sequentially causes counting of the second and third series of address counters.

2. A control system according to claim 1, wherein:
   when all address counting for the first address region is completed in response to an output from an address counter for a final address in the first address region, the control circuit drives the path switches to start address counting for the second address region, and when all address counting is completed in response to an output from an address counter for a final address in the second address region, the control circuit generates an end signal indicating that all address counting for the first and second address regions is completed.

3. A control system for a refresh counter for a memory device that requires refreshing and that includes a normal address region having "nth power of 2" contiguous addresses and a parity address region having a non-contiguous address region portion with non-contiguous addresses, the number of non-contiguous addresses being different from "nth power of 2", the address-counter control system comprising:
   a counter circuit having address counters, the number of address counters corresponding to the normal address region, the address counters comprising a first series of address counters which corresponds to the non-contiguous address region portion and second and third series of address counters which correspond to respective contiguous region portions and which are located at two opposite ends of the first series of address counters;
   path switches that are provided at connection paths between the second and the third series of address counters, wherein the path switches disconnect the first series of address counters and directly connect the second and third series of address counters or disconnect the direct connection between the second and third series of address counters and connect the first series of address counters to and between the second and the third series of address counters; and
   a control circuit, wherein, for forming the normal address region, the control circuit controls the path switches to disconnect the direct connection between the second and the third series of address counters and connect the first series of address counters to and between the second and the third series of address counters, so that the non-contiguous address region portion is placed in the normal address region, and sequentially causes counting of the first, second, and third series of address counters, and wherein, for putting the parity address region into a contiguous state, the control circuit controls the path switches to disconnect the first series of address counters and directly connect the second and third series of address counters and sequentially causes counting of the second and third series of address counters.

4. A control system according to claim 3, wherein:
   during a refresh operation of the memory device, when all address counting for the normal address region, starting from a first address counter corresponding to the normal address region, is completed in response to an output from an address counter for a final address in the normal address region, the control circuit drives the path switches to start address counting for the parity address region, and when all address counting is completed in response to an output from an address counter for a final address in the parity address region, the control circuit generates a refresh end signal indicating that all address counting for both of the normal and parity regions is completed.

5. A control system according to claim 3, wherein:
the control circuit retains a counter value of one of the address counters, and during a refresh operation of the memory device, for the normal region, the control circuit causes counting of an address counter following the address counter whose counter value is retained, and, in response to an address counter output that matches the retained counter value, the control circuit drives the path switches to start address counting for the parity address region, wherein, when all address counting for the parity address region is completed and the retained counter value is reached, the control circuit generates a refresh end signal indicating that all address counting for both of the normal and parity regions is completed.

6. A control system according to claim 5, wherein:
when an address corresponding to the retained address counter value is in the non-contiguous address region portion, a count value of a first address following the non-contiguous address region portion in the parity address region is substituted for the retained counter value.

* * * * *